(12) United States Patent
Park et al.

(10) Patent No.: US 7,034,365 B2
(45) Date of Patent: Apr. 25, 2006

(54) INTEGRATED CIRCUIT DEVICES HAVING CONTACT HOLES EXPOSING GATE ELECTRODES IN ACTIVE REGIONS

(75) Inventors: Jeung-Hwan Park, Gyeonggi-do (KR); Myoung-Kwan Cho, Gyeongsangbuk-do (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/769,649

(22) Filed: Jan. 30, 2004

(65) Prior Publication Data

US 2004/0169207 A1 Sep. 2, 2004

(30) Foreign Application Priority Data

Feb. 3, 2003 (KR) .................. 10-2003-006598

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............... 257/365; 257/368; 257/369
(58) Field of Classification Search ............ 257/365, 257/274, 270, 368, 369
See application file for complete search history.

(56) References Cited

U.S. PATENT DOCUMENTS

| 6,223,331 | B1 | 4/2001 | Juengling | 716/10 |
| 6,313,508 | B1 * | 11/2001 | Kobayashi | 257/351 |
| 6,815,771 | B1 * | 11/2004 | Kimura | 257/347 |

* cited by examiner

*Primary Examiner*—Phat X. Cao
(74) *Attorney, Agent, or Firm*—Myers Bigel Sibley & Sajovec

(57) ABSTRACT

Integrated circuit devices are provided including an integrated circuit substrate and first, second and third spaced apart insulating regions in the integrated circuit substrate that define first and second active regions. A first gate electrode is provided on the first active region. The first gate electrode has a first portion on the first active region that extends onto the first insulating region and a second portion at an end of the first portion on the first insulating region. A second gate electrode is provided on the second active region. An insulating layer is provided on the first, second and third active regions defining a first gate contact hole that exposes at least a portion of the second portion of the first gate electrode. The first gate electrode is free of a gate contact hole on the first portion of the first gate electrode. A second gate contact hole is provided on the second active region that exposes at least a portion of the second gate electrode. Related methods of fabricating integrated circuit devices are also provided.

5 Claims, 3 Drawing Sheets

INTEGRATED CIRCUIT DEVICES HAVING CONTACT HOLES EXPOSING GATE ELECTRODES IN ACTIVE REGIONS

RELATED APPLICATION

This application is related to and claims priority from Korean Application No. 2003-006598, filed Feb. 3, 2003, the disclosure of which is hereby incorporated herein by reference as if set forth in its entirety.

FIELD OF THE INVENTION

The present invention relates to integrated circuit devices and methods of fabricating the same and, more particularly, to metal oxide semiconductor (MOS) transistors and methods of fabricating the same.

BACKGROUND OF THE INVENTION

Conventional metal oxide semiconductor (MOS) transistors are widely used in, for example, integrated circuit memory devices. Typically, a MOS transistor is provided on an active region in an integrated circuit substrate. Furthermore, a MOS transistor typically includes a source, a drain and a gate. The source and drain regions are spaced apart from one another to provide a channel region between the source and the drain regions. An insulated gate including a gate insulating layer, for example, an oxide layer, and a gate electrode, is typically provided on the channel region between the source and drain regions.

A conventional layout of a MOS transistor is discussed in, for example, U.S. Pat. No. 6,223,331 to Juengling, entitled Semiconductor Circuit Design Method for Employing Spacing Constraints and Circuits Thereof. Juengling discusses a method of providing a circuit layout having adequate spacing between transistors. As discussed therein, the spacing of a particular circuit layout may be determined to be outside a particular spacing constraint and additional circuitry may be added to the circuit to bring the spacing of the circuit layout to within the spacing constraint. However, circuits corrected using the methodology discussed in Juengling may have an increased area due to, for example, the inclusion of one or more additional gate lines provided to correct the spacing of the circuit layout. Accordingly, improved devices and methods may be desired that may, for example, reduce the area occupied by the device.

SUMMARY OF THE INVENTION

Embodiments of the present invention provide integrated circuit devices including an integrated circuit substrate and first, second and third spaced apart insulating regions in the integrated circuit substrate that define first and second active regions. A first gate electrode is provided on the first active region. The first gate electrode has a first portion on the first active region that extends onto the first insulating region and a second portion at an end of the first portion on the first insulating region. A second gate electrode is provided on the second active region. An insulating layer is provided on the first, second and third active regions defining a first gate contact hole that exposes at least a portion of the second portion of the first gate electrode. The first gate electrode is free of a gate contact hole on the first portion of the first gate electrode. A second gate contact hole is provided on the second active region that exposes at least a portion of the second gate electrode.

In some embodiments of the present invention, the second gate electrode includes a first portion on the second active region that extends on the third insulating region and a second portion at an end of the first portion on the third insulating region.

In further embodiments of the present invention, the second gate contact hole may expose at least a portion of the first portion of the second gate electrode. In certain embodiments, the insulating layer may further define a third gate contact hole. The third gate contact hole may expose at least a portion of the second portion of the second gate electrode. The insulating layer may further define a fourth gate contact hole. The fourth gate contact hole may expose at least of portion of the first portion of the second gate electrode.

In still further embodiments of the present invention the integrated circuit device may further include a first gate interconnect that is electrically coupled to the second portion of the first gate electrode through the gate contact hole and a second gate interconnect that is electrically coupled to the second gate electrode through the direct gate contact hole.

In some embodiments of the present invention, the first region of the integrated circuit substrate may include a short channel metal oxide semiconductor (MOS) transistor region and the second region of the integrated circuit substrate may include a long channel MOS transistor region. The first gate electrode may have a first width and the second gate electrode may have a second width and the second width may be greater than the first width.

Further embodiments of the present invention may include first and second gate insulating layers. The first gate insulating layer may be provided between the first gate electrode and the first active region. The second gate insulating layer may be provided between the second gate electrode and the second active region. The first region of the integrated circuit substrate may include a low voltage MOS transistor region and the second region of the integrated circuit substrate may include a high voltage MOS transistor region. The first gate insulating layer may have a first thickness and the second gate insulating layer may have a second thickness, the second thickness may be thicker than the first thickness.

While the present invention is described above primarily with reference to integrated circuit devices, methods of fabricating integrated circuit devices are also provided herein.

DETAILED DESCRIPTION

Figure 1:
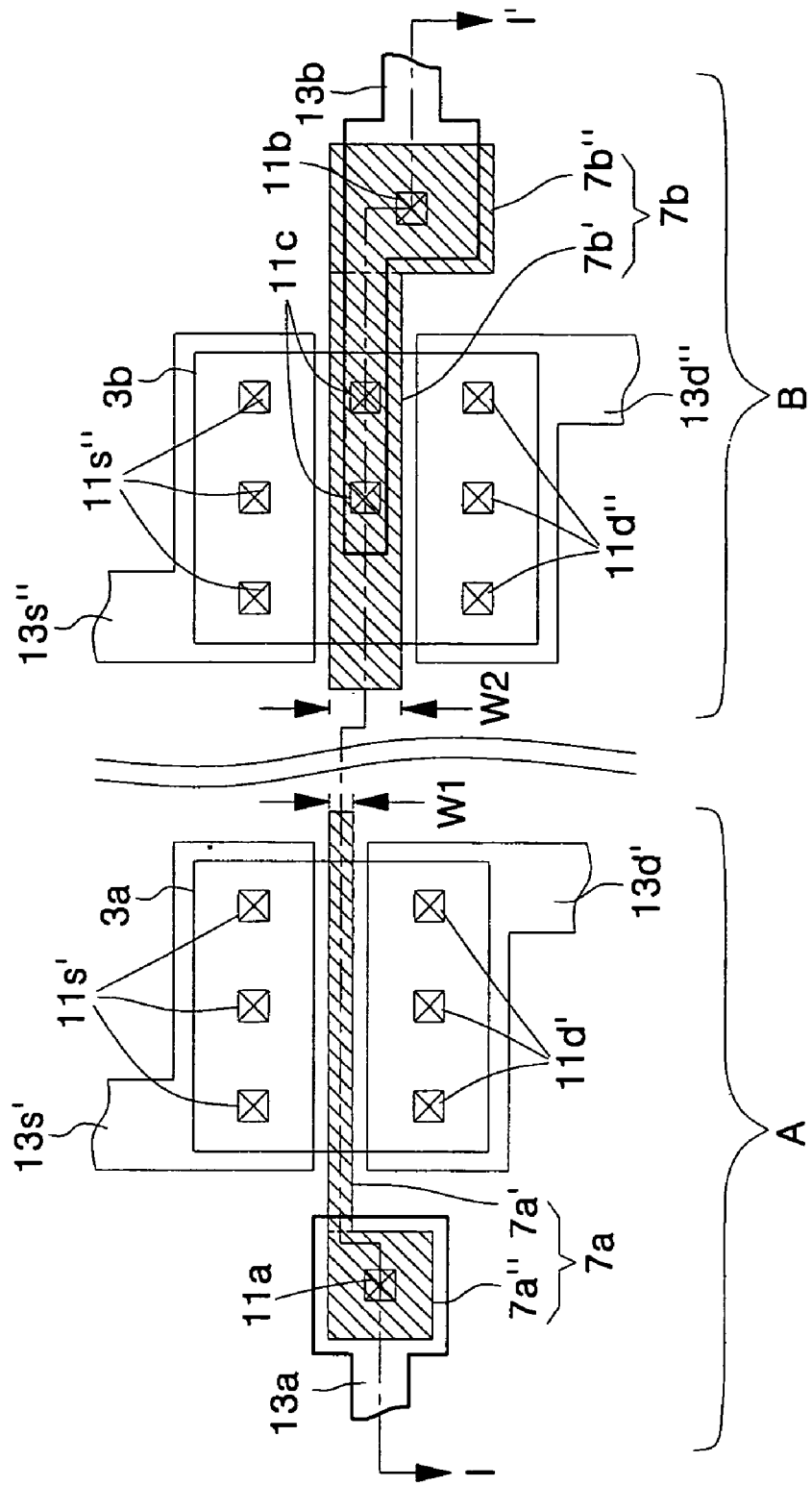
FIG. 1 is a plan view of integrated circuit devices according to some embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. It will be understood that when an element such as a layer, region or substrate is referred to as "under" or "beneath" another element, it can be directly under the other element or intervening elements may also be present. It will be understood that when part of an element is referred to as "outer," it is closer to the outside of the integrated circuit than other parts of the element. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Embodiments of the present invention will be described below with respect to FIGS. 1 through 3. Embodiments of the present invention provide integrated circuit devices having first and second active regions. A gate electrode may be positioned on the second active region without extending on a device isolation layer and may be electrically coupled to a gate interconnect through a direct contact hole in an insulating layer. The placement of the second gate electrode on the active region without extending onto the device isolation layer may provide integrated circuit devices having a reduced area and, thus, may be used in highly integrated devices. In further embodiments of the present invention, the second gate electrode may include first and second portions. The first portion of the second gate electrode may be on the second active region and the second portion of the second gate electrode may extend onto the device isolation layer. The first portion of the second gate electrode may be exposed by first and second direct contact holes and the second portion may be exposed by a third gate contact hole. Increasing the number of contact holes exposing portions of the second gate electrode may reduce the contact resistance of the gate interconnection electrically coupled to the second gate electrode through the first, second and third contact holes as discussed below.

Figure 2:
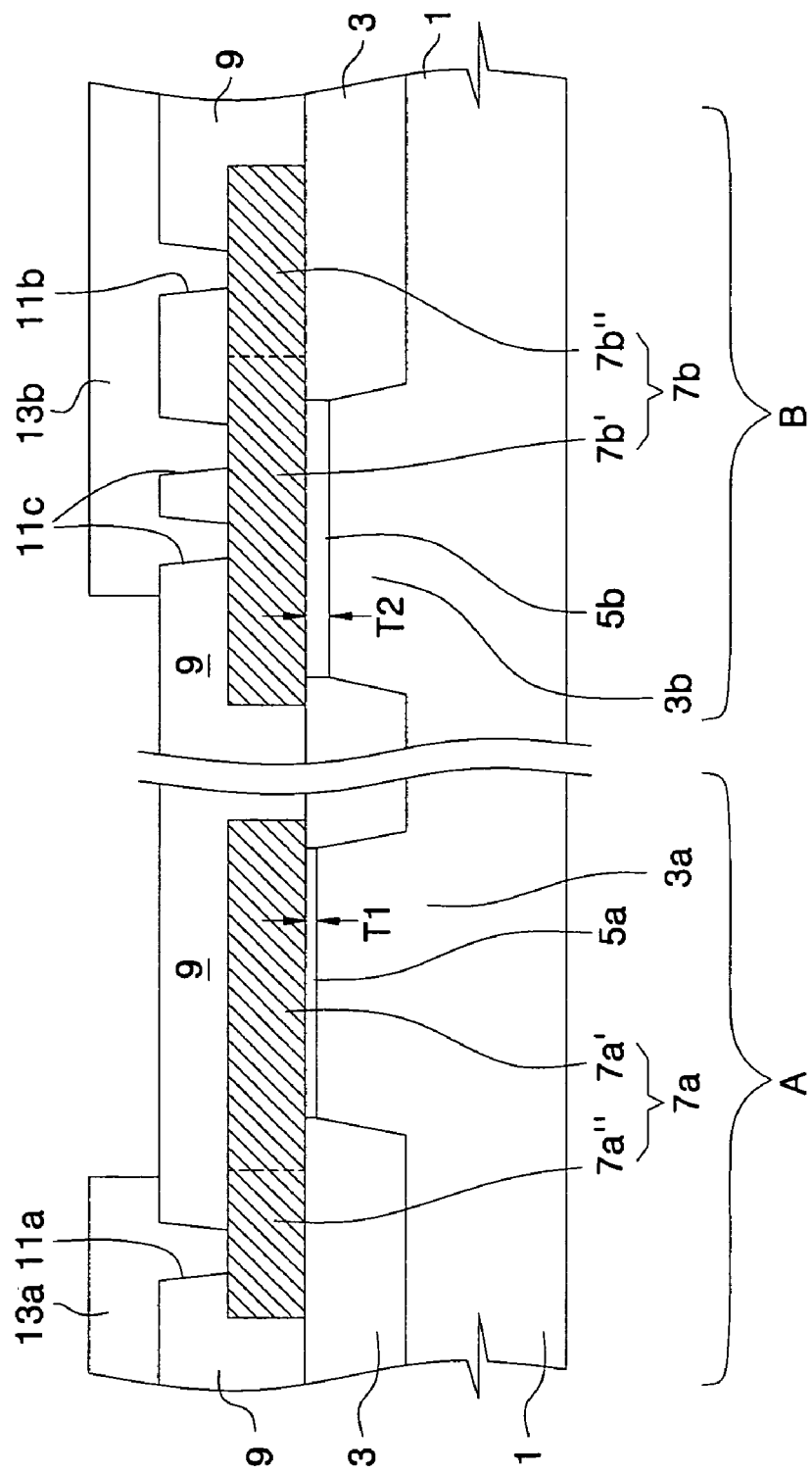
FIG. 2 is a cross-section of the integrated circuit devices illustrated in FIG. 1 taken along the line I–I' according to some embodiments of the present invention.
Figure 3:
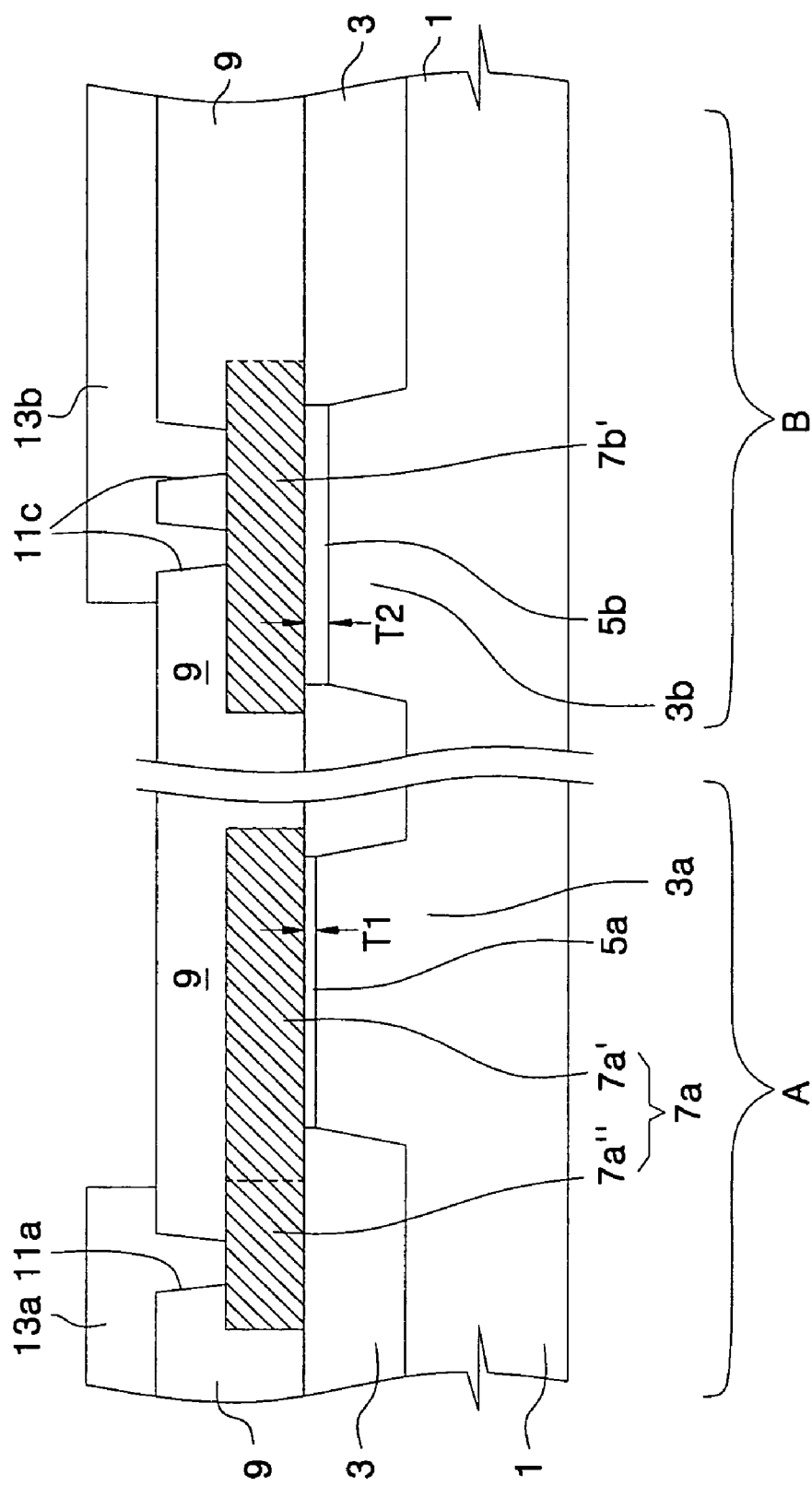
FIG. 3 is a cross-section of integrated circuit devices according to further embodiments of the present invention.

Referring now to FIGS. 1 and 2, a plan view illustrating integrated circuit devices according to embodiments of the present invention and a cross-section of the integrated circuit devices taken along the line I–I' of FIG. 1 will be discussed. As illustrated in the Figures, an integrated circuit substrate 1 is provided. A first region A and a second region B are provided on the integrated circuit substrate 1. In certain embodiments of the present invention, the first region may be a short channel metal oxide semiconductor (MOS) transistor region and the second region B may be a long channel MOS transistor region. In further embodiments of the present invention, the first region A may be a low voltage MOS transistor region and the second region B may be a high voltage MOS transistor region.

A device isolation layer 3 is provided on the integrated circuit substrate 1. The device isolation layer 3 defines a first active region 3a in the first region A of the integrated circuit substrate 1 and a second active region 3b in the second region B of the integrated circuit substrate 1. A first gate insulating layer 5a is provided on the first active region 3a and a second gate insulating layer 5b is provided on the second active region 3b. A first gate electrode 7a is provided on the first gate insulating layer 5a, such that the first gate insulating layer 5a is between the first gate electrode 7a and the first active region 3a. A second gate electrode 7b is provided on the second gate insulating layer 5b, such that the second gate insulating layer 5b is between the second gate electrode 7b and the second active region 3b.

The first gate electrode 7a has a first width W1 and the second gate electrode 7b has a second width W2. In some embodiments of the present invention the first and second widths W1 and W2 may be the same and in further embodiments of the present invention the first and second widths W1 and W2 may be different. The first width W1 of the first gate electrode 7a corresponds to a channel length of a MOS transistor to be formed at the first active region 3a. Similarly, the second width W2 of the second gate electrode 7b corresponds to a channel length of a MOS transistor to be formed at the second active region 3b. The formation of the first and second MOS transistors will be discussed below. Furthermore, the first gate insulating layer 5a has a first thickness T1 and the second gate insulating layer 5b has a second thickness T2. In some embodiments of the present invention, the first and second thicknesses T1 and T2 may be the same and in further embodiments of the first and second thicknesses T1 and T2 may be different.

In embodiments of the present invention where the first region A is a short channel MOS transistor region and the second region B is a long channel MOS transistor region, the second width W2 of the second gate electrode 7b is greater than the first width W1 of the first gate electrode 7a. Furthermore, the second thickness T2 of the second gate insulating layer 5b is typically greater than the first thickness T1 of the first gate insulating layer 5a, but as discussed above the second thickness T2 may be equal to the first thickness T1.

In further embodiments of the present invention where the first region A is a low voltage MOS transistor region and the second region B is a high voltage MOS transistor region, the second width W2 of the second gate electrode 7b is typically greater than the first width W1 of the first gate electrode 7a. However, in certain embodiments of the present invention, the second width W2 of the second gate electrode 7b may be equal to the first width W1 of the first gate electrode 7a. Furthermore, the second thickness T2 of the second gate insulating layer 5b is greater than the first thickness T1 of the first gate insulating layer 5a.

In particular, when the second width W2 of the second gate electrode 7b is greater than the first width W1 of the first gate electrode 7a and the second thickness T2 of the second gate insulating layer 5b is greater than the first thickness T1 of the first gate insulating layer 5a, the first region A may be a low voltage MOS transistor region and the second region B may be a high voltage MOS transistor region in a peripheral circuit region of an integrated circuit memory device such as, for example, a flash memory device. In other embodiments of the present invention when the second width W2 of the second gate electrode 7b is greater than the first width W1 of the first gate electrode 7a and the second thickness T2 of the second gate insulating layer 5b is greater than the first thickness T1 of the first gate insulating layer 5a, the first region A may be a low voltage MOS transistor region and the second region B may be a high voltage MOS transistor region of an integrated circuit device such as, for example, a liquid crystal display (LCD) driver integrated circuit (IC).

The first gate electrode 7a may include a first gate overlap 7a' (a first portion) on the first active region 3a and a first gate extension 7a" (a second portion) that extends from an end of the first gate overlap 7a' away from the first gate overlap 7a'. The first gate extension 7a" is provided on the device isolation layer 3 adjacent to the first active region 3a. Similarly, in some embodiments of the present invention, the second gate electrode 7b may include a second gate overlap 7b' (a first portion) on the second active region 3b, and a second gate extension 7b" (a second portion) that extends from an end of the second gate overlap 7b' away from the second gate overlap 7b'. The second gate extension 7b" is provided on the device isolation layer 3 adjacent to the second active region 3b. In certain embodiments of the present invention, the second gate electrode 7b may only include the second gate overlap 7b' as illustrated in FIG. 3.

An interlayer insulating layer 9 is provided on the integrated circuit substrate 1 having the first and second gate electrodes 7a and 7b. A first gate contact hole 11a is formed in the interlayer insulating layer 9 that exposes at least a portion of the first gate extension 7a". First and second direct gate contact holes 11c are formed in the interlayer insulating layer 9 that expose at least a portion of the second gate overlap 7b'. In some embodiments of the present invention, the second gate electrode 7b does not include the second gate extension 7b' as illustrated in FIG. 3. In these embodiments, the second gate electrode 7b may have a width that is greater than a minimum width of the first and second direct gate contact holes 11c. Accordingly, since the length of the second gate electrode 7b without the second portion 7b" may be reduced, it may be possible to realize a compact integrated circuit. Thus, the integration density of integrated circuit devices according to embodiments of the present invention may be increased.

Alternatively, as illustrated in FIGS. 1 and 2, the second gate electrode 7b may include the second gate overlap 7b' and the second gate extension 7b". As illustrated, a second gate contact hole 11b is provided in the interlayer insulating layer 9 that exposes at least a portion of the second gate extension 7b". The second gate electrode 7b is exposed by the direct gate contact holes 11c and the second gate contact hole 11b. In these embodiments of the present invention, the exposed area of the second gate electrode 7b may be increased, thus, potentially allowing reduction of the contact resistance of an interconnection line on the first and second direct gate contact holes 11c and the second gate contact hole 11b. Accordingly, it may be possible to reduce the delay time of the electrical signal applied to the second gate electrode 7b.

The first active region 3a is divided into two regions, for example, a first source region and a first drain region by the first gate electrode 7a. As illustrated in FIG. 1, a first source contact hole 11s' is provided in the interlayer insulating layer 9 that exposes the first source region, and a first drain contact hole 11d' is provided in the interlayer insulating layer 9 that exposes the first drain region. Similarly, the second active region 3b is divided into two regions, for example, a second source region and a second drain region by the second gate electrode 7b. A second source contact hole 11s" is provided in the interlayer insulating layer 9 that exposes the second source region, and a second drain contact hole 11d" is provided in the interlayer insulating layer 9 that exposes the second drain region.

A first gate interconnection 13a and a second gate interconnection 13b are disposed on the interlayer insulating layer 9. The first gate interconnection 13a is provided in the first gate contact hole 11a, and the second gate interconnection 13b is provided in the direct gate contact hole 11c. The first gate interconnection 13a is electrically coupled to the first gate electrode 7a through the first gate contact hole 11a. Similarly, the second gate interconnection 13b is electrically coupled the second gate electrode 7b through the direct gate contact hole 11c.

In embodiments of the present invention illustrated in FIGS. 1 and 2 where the second gate electrode 7b includes the second gate extension 7b", the second gate interconnection 13b is also electrically coupled to the second gate electrode 7b through the direct gate contact holes 11c and the second gate contact hole 11b. Accordingly, the contact resistance between the second gate interconnection 13b and the second gate electrode 7b may potentially be reduced as discussed above. Thus, it may be possible to reduce the delay time of the electrical signal applied to the second gate electrode 7b through the second gate interconnection 13b.

First and second source interconnections 13s' and 13s" as well as first and second drain interconnections 13d' and 13d" may be provided on the interlayer insulating layer 9. The first source interconnection 13s' is provided on the first source contact hole 11s' and the second source interconnection 13s" is provided on the second source contact hole 11s". The first drain interconnection 13d' is provided on a first drain contact hole 11d' and second drain interconnection 13d" is provided on a second drain contact hole 11d". Accordingly, the first source interconnection 13s' is electrically coupled to the first source region through the first source contact hole 11s', and the second source interconnection 13s" is electrically coupled to the second source region through the second source contact hole 11s". Similarly, the first drain interconnection 13d' is electrically coupled to the first drain region through the first drain contact hole 11d', and the second drain interconnection 13d" is electrically coupled to the second drain region through the second drain contact hole 11d".

As discussed above with respect to FIGS. 1 through 3, a direct gate contact hole that exposes a gate electrode in the long channel MOS transistor region or a high voltage MOS transistor region may be located over the active region, thus, potentially eliminating the need to form a gate extension on a field region of the transistor adjacent to the active region. Thus, it may be possible to reduce the area of a device isolation layer, for example, the field region in the long channel MOS transistor region or the high voltage MOS transistor region. Accordingly, it may be possible to reduce the overall size of the device.

Furthermore, as discussed above, a gate electrode in the long channel MOS transistor region or the high voltage MOS transistor region may include a gate extension and the number of the gate contact holes exposing the gate electrode may be increased. As a result, even though the area of the device isolation layer may not be reduced, the contact resistance of the interconnection electrically connected to the gate electrode can be reduced. Accordingly, it may be possible to improve the performance of an integrated circuit including the long channel MOS transistor or the high voltage MOS transistor.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device comprising:

an integrated circuit substrate;

first, second and third spaced apart insulating regions in the integrated circuit substrate that define first and second active regions;

a first gate electrode on the first active region, the first gate electrode having a first portion on the first active region that extends onto the first insulating region and a second portion at an end of the first portion on the first insulating region;

a second gate electrode on the second active region; and an insulating layer on the first, second and third insulating regions defining a first gate contact hole that exposes at least a portion of the second portion of the first gate electrode, the first gate electrode being free of a gate contact hole on the first portion, and a second gate contact hole on the second active region that exposes at least a portion of the second gate electrode;

wherein the second gate electrode comprises a first portion on the second active region that extends on the third insulating region and a second portion at an end of the first portion on the third insulating region and wherein the second gate contact hole exposes at least a portion of the first portion of the second gate electrode, wherein the insulating layer further defines a third gate contact hole, and wherein the third gate contact hole exposes at least a portion of the second portion of the second gate electrode.

2. The integrated circuit device of claim 1 wherein the insulating layer further defines a fourth gate contact hole, the fourth gate contact hole exposing at least of portion of the first portion of the second gate electrode.

3. The integrated circuit device of claim 1 further comprising:

a first gate interconnect that is electrically coupled to the second portion of the first gate electrode through the first gate contact hole; and a second gate interconnect that is electrically coupled to the second gate electrode through the second gate contact hole.

4. An integrated circuit device comprising:

an integrated circuit substrate;

first, second and third spaced apart insulating regiong in the integrated circuit substrate that define first and second active regions;

a first gate electrode on the first active region, the first gate electrode having a first portion on the first active region that extends onto the first insulating region and a second portion at an end of the first portion on the first insulating region;

a second gate electrode on the second active region; and an insulating layer on the first, second and third insulating regions defining a first gate contact hole that exposes at least a portion of the second portion of the first gate electrode, the first gate electrode being free of a gate contact hole on the first portion, and a second gate contact hole on the second active region that exposes at least a portion of the second gate electrode and wherein the first region of the integrated circuit substrate comprises a short channel MOS transistor region and the second region of the integrated circuit substrate comprises a long channel MOS transistor region, wherein the first gate electrode has a first width and the second gate electrode has a second width and wherein the second width of the second gate electrode is greater than the first width of the first gate electrode.

5. The integrated circuit device of claim 1 further comprising:

a first gate insulating layer between the first gate electrode and the first active region, the first gate insulating layer having a first thickness; and a second gate insulating layer between the second gate electrode and the second active region, the second gate insulating layer having a second thickness, wherein the first region of the integrated circuit subsirate comprises a low voltage MOS transistor region and the second region of the integrated circuit substrate comprises a high voltage MOS transistor region, and wherein the second thickness of the second gate insulating layer is thicker than the first thickness of the first gate insulating layer.

* * * * *

UNITED STATES PATENT AND TRADEMARK OFFICE
CERTIFICATE OF CORRECTION

| | |
|---|---|
| PATENT NO. | : 7,034,365 B2 |
| APPLICATION NO. | : 10/769649 |
| DATED | : April 25, 2006 |
| INVENTOR(S) | : Jeung-Hwan Park et al. |

It is certified that error appears in the above-identified patent and that said Letters Patent is hereby corrected as shown below:

Column 8, line 3, change "regiong" to -- regions --.
Column 8, line 35, change "subsirate" to -- substrate --.

Signed and Sealed this

Twenty-ninth Day of August, 2006

JON W. DUDAS
*Director of the United States Patent and Trademark Office*